United States Patent

[11] 3,597,641

[72] Inventor Neville Leigh Ayres Leatherhead, Surrey, England

[21] Appl. No. 825,799

[22] Filed May 19, 1969

[45] Patented Aug. 3, 1971

[73] Assignee AMF International Limited London, England

[32] Priority May 17, 1968

[33] Great Britain

[31] 23576/68

[54] INTEGRATED CIRCUIT CHIPS
9 Claims, 4 Drawing Figs.

[52] U.S. Cl. .......... 307/303, 307/213, 307/238, 307/242, 307/246, 328/51, 328/45, 235/92 EA

[51] Int. Cl. .......... H03k 21/12

[50] Field of Search .......... 328/51, 37, 45; 235/92; 307/213, 238, 242, 246, 303

[56] References Cited

UNITED STATES PATENTS

| | | | |
|---|---|---|---|
| 2,841,334 | 7/1958 | Abate | 328/51 X |
| 3,130,387 | 4/1964 | Wright et al. | 235/92 X |
| 3,505,503 | 4/1970 | Quivy | 235/92 |

*Primary Examiner*—John S. Heyman
*Attorney*—Karl W. Flocks

ABSTRACT: The present invention provides an integrated circuit package having a plurality of package connection electrodes and containing a semiconductor chip, the semiconductor chip having formed thereon a first chain of $n$ first count to X circuit elements each having an individual output, an input terminal to the chain connected to a first of said connection electrodes, a reset terminal for the chain connected to a second of said connection electrodes, said first chain being arranged to divide by $X^n$, a plurality of storage count to X circuit elements associated one with each of said $n$ first count to X circuit elements, each said storage count to X circuit elements having an individual input and an individual output, a plurality of transfer gate circuit elements interposed one between the individual output of each said first count to X circuit element and the individual input of its associated storage count to X circuit element, each said transfer gate having a control input terminal for a signal to transfer the content of its respective first count to X circuit element to its associated storage count to X circuit element and the input terminals of all said transfer gates being connected to a third of said connection electrodes, and a plurality of output gate circuit elements associated one with each said storage count to X circuit element and connected to the output thereof, each said output gate gate circuit element having an output connected to a first group of said connection electrodes and a control input terminal operatively connected to a second group of said connection electrodes so that the content of each said storage count to X circuit element may be made selectively available at said second group of connection electrodes.

Inventor:
Neville Leigh Ayres
By
Karl W. Flocks
Attorney

INTEGRATED CIRCUIT CHIPS

BACKGROUND OF THE INVENTION

This invention relates to integrated circuit chips.

The use of a silicon chip incorporating a monolithic integrated electronic circuit is well known particularly in the production of logic circuits used in digital counters and allied instruments. The success achieved in producing comparatively simple integrated logic circuits on a single chip led to the development of chips incorporating more complex circuits such as complete decade counter units and decoder/display driver modules.

As the circuitry desired in a single chip becomes more complex considerable problems arise. Very large overhead costs are involved in the production of chips incorporating complex circuit forms so that to be economically viable each circuit form must have a multiplicity of applications so as to permit large scale production. In addition as the complexity of circuit form inside a single chip increases so the number of external connections for each chip also increases. Each external connection requires a bonding pad on the chip and also interface circuitry to provide compatibility between the internal and external circuits. In the case of M.O.S. (metal oxide/silicon field effect) technology the area on the chip occupied by each bonding pad and its interface circuitry is large compared with normal logic circuitry so that every additional connection reduces dramatically the amount of circuitry that may be incorporated within the chip. Similar considerations apply to other technologies.

It is unlikely to prove economic to produce a complete digital counter on one chip since such units vary considerably in their main parameters such as operational facilities, counting speed, gating times etc. To enable a universal unit to be produced capable of performing even a small proportion of the most widely used configurations would lead to an extremely complex device with many connections.

Thus it is more feasible to consider those sections of a digital counter which are universally used and which in consequence could lead to a wide scale demand. This tends to restrict the selection to the decade chains themselves.

In the normal digital counter there are usually two decades chains, a counterchain which totalizes and records the pulse signals fed to it during the gating time and a divider chain which divides down the basic clock frequency to provide gating control signals. The requirements for the two chains are somewhat different but both employ basically the same type of circuitry.

It is accordingly an object of the present invention to provide an improved integrated circuit chip incorporating a circuit module having wide scale application particularly in digital counters and with a minimum number of external connections.

SUMMARY OF THE INVENTION

According to one aspect of the present invention there is provided an integrated circuit chip incorporating a chain of counters each coupled with separate output gating circuits the output gating circuits being controlled by at least one output control logic circuit. Each of the counters may be decade counters and may be coupled via separate transfer circuits and separate storage elements with its associated output gating circuit. The chip may also incorporate an input gating system in advance of the first decade counter of the chain.

The above and other aspects of the present invention will not be described by way of example with reference to the accompanying drawings in which:

DESCRIPTION OF THE PREFERRED EMBODIMENT

Figure 1:
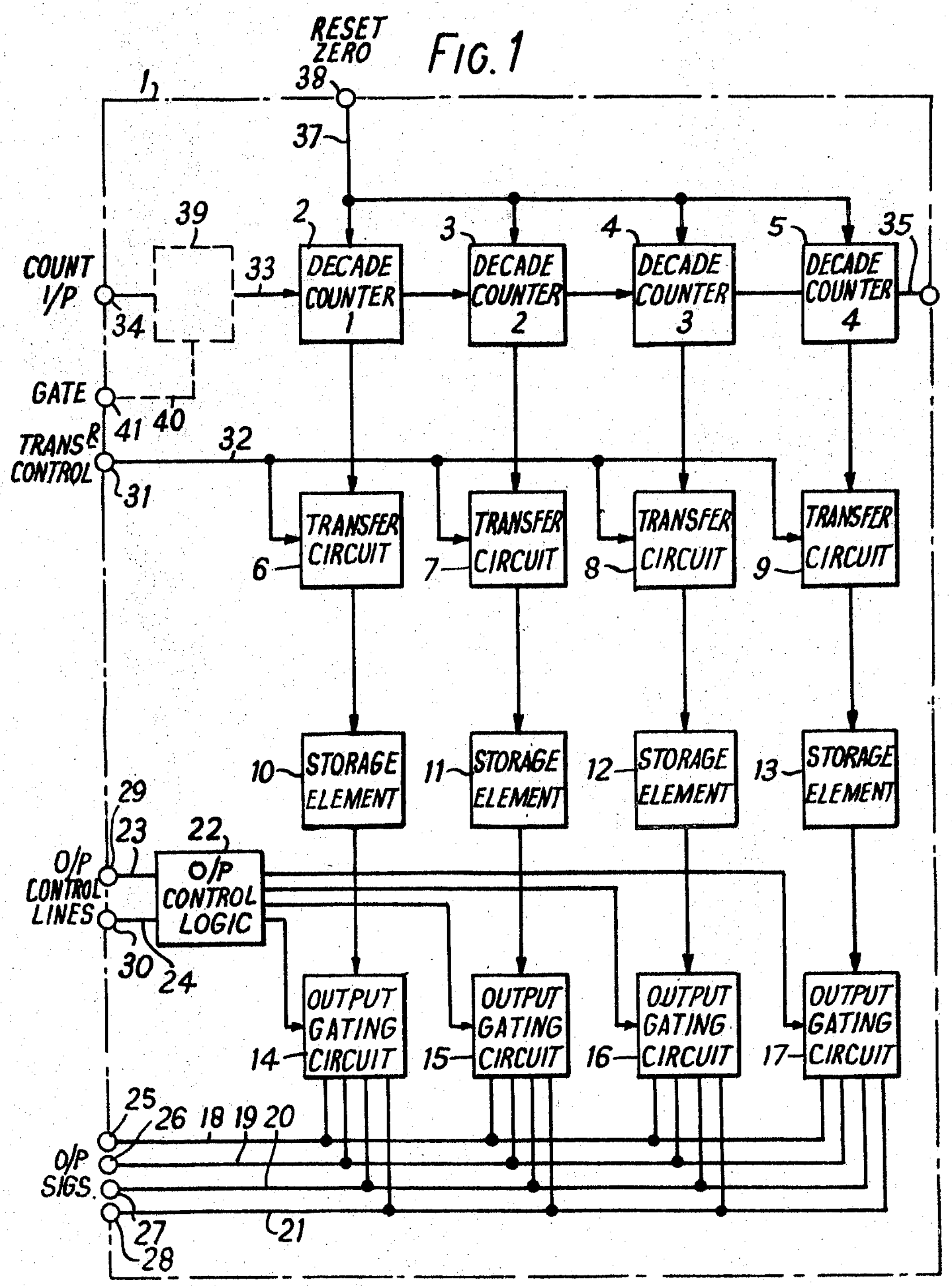
FIG. 1. shows diagrammatically an integrated circuit chip according to the invention.

Referring to FIG. 1 a silicon chip is shown in chain lines and incorporates four decade counters 2,3,4, and 5 connected in cascade to form a divide by $10^4$ chain. Each decade drives, via an associated transfer circuit 6,7,8 and 9 a corresponding storage element 10,11,12 and 13. The storage elements each feed a coded output via separate gates 14,15, 16 and 17 and a four-wire bc.d. set of output lines 18,19,20 and 21. The gates 14—17 are controlled by an output control logic circuit 22 arranged to receive coded input signals over lines 23 and 24 to ensure that only one of the storage elements 10—13 is connected to the output lines 18—21 at any one time.

Although as described above the chip incorporates four decade counters it will be understood that this is merely a convenient number and can be varied as desired. With a four-line bc.d. output code it will be understood that there will by only four output lines irrespective of the number of decade counters. Each of the output lines 18—21 is connected to a bonding pad such as 25—28 on the surface of the chip. Additional bonding pads 29 and 30 are required to feed signals to the output control logic circuit 22 and a bonding pad 31 is required to control operation of the transfer circuits 6—9 over the line 32. This is achieved in such a way that when the transfer control line 32 is held in say the -1- state the storage units 10—13 will follow the state of their associated decade units 2—5 and when the transfer control line 32 is held in the -0- state the two groups of units are isolated from each other. The chain of decade counters 2—5 has an input line 33 connected with an input bonding pad 34 on the chip surface and an output line 35 connected with an output bonding pad 36 on the chip surface and in addition each of the decade counters may be reset to zero over a common line 37 receiving signals through a bonding pad 38 on the surface of the chip.

It will be understood that with the arrangement above described using four decade counters two coded input signal lines 23 and 24 are required. If only two decade counters were used one input signal line would suffice and the number of those lines increases by only one each time the number of decade counters is doubled. Thus this arrangement reduces considerably the number of bonding pads required on the chip, this reduction being proportionately greater as the number of decade counters increases.

Assuming two additional pads on the chip surface of FIG. 1 and appropriate internal connections for the supply of electric current to the circuit, then where the latter includes four decade counters the maximum number of external connections required is 12.

If an input gating system is desired an appropriate circuit indicated at 39 is interposed in the decade counter input line 33 and controlled over line 40 by signals passing through an additional bonding pad 31 on the chip surface. In this event it will be understood that the maximum number of external connections becomes 13.

A decade divider chain in a digital counter is required to operate at the frequency of the internal reference oscillator and should provide output signals at one-tenth, one-hundredth etc. of this frequency, The internal reference frequency is usually 1 MHz. although in some instances it may be as high as 10MHz. The maximum division factor is usually $10^7$ to provide a 10-second period from the 1 MHz. standard although it may be as high as $10^8$. Additional facilities occasionally required are provision for remote programming of the output signal and coded outputs for applications requiring gating times other than decade submultiples of the clock frequency.

A counter chain in a digital counter is required to operate at the maximum input frequency of the instrument or system. Intermediate decade outputs are not usually required but coded outputs are needed to drive readout and printout systems. In addition a buffer storage system is often required to hold the result obtained during a previous measurement while a new result is being accumulated by a decade counter. This buffer storage arrangement should have outputs suitable for driving a display or readout system.

The requirements for both a divider chain and a counter chain set out in the above two paragraphs are fully met by the circuit of FIG. 1 incorporated in a single silicon chip.

When used in the counter chain of a digital instrument chips of FIG. 1 would be cascaded to provide the required number of digits. Thus for an eight-digit counter two chips would be used. Throughout the normal counting sequence the decade counters 2—5 would be isolated from the storage elements 10—13 but at the end of each count period a suitable transfer command would be given at the bonding pad 31 and over line 32 so that the count recorded by the unit is passed to the storage elements 10—13 the decade counters 2—5 may subsequently be reset to zero and be free to record a new measurement.

In order to drive a display system the output control logic circuit 22 is energized over lines 23 and 24 to provide sequential outputs to the output gating circuits 14—17 so as selectively to connect the storage elements 10—13 to the output lines 18—21 in turn.

Figure 2:
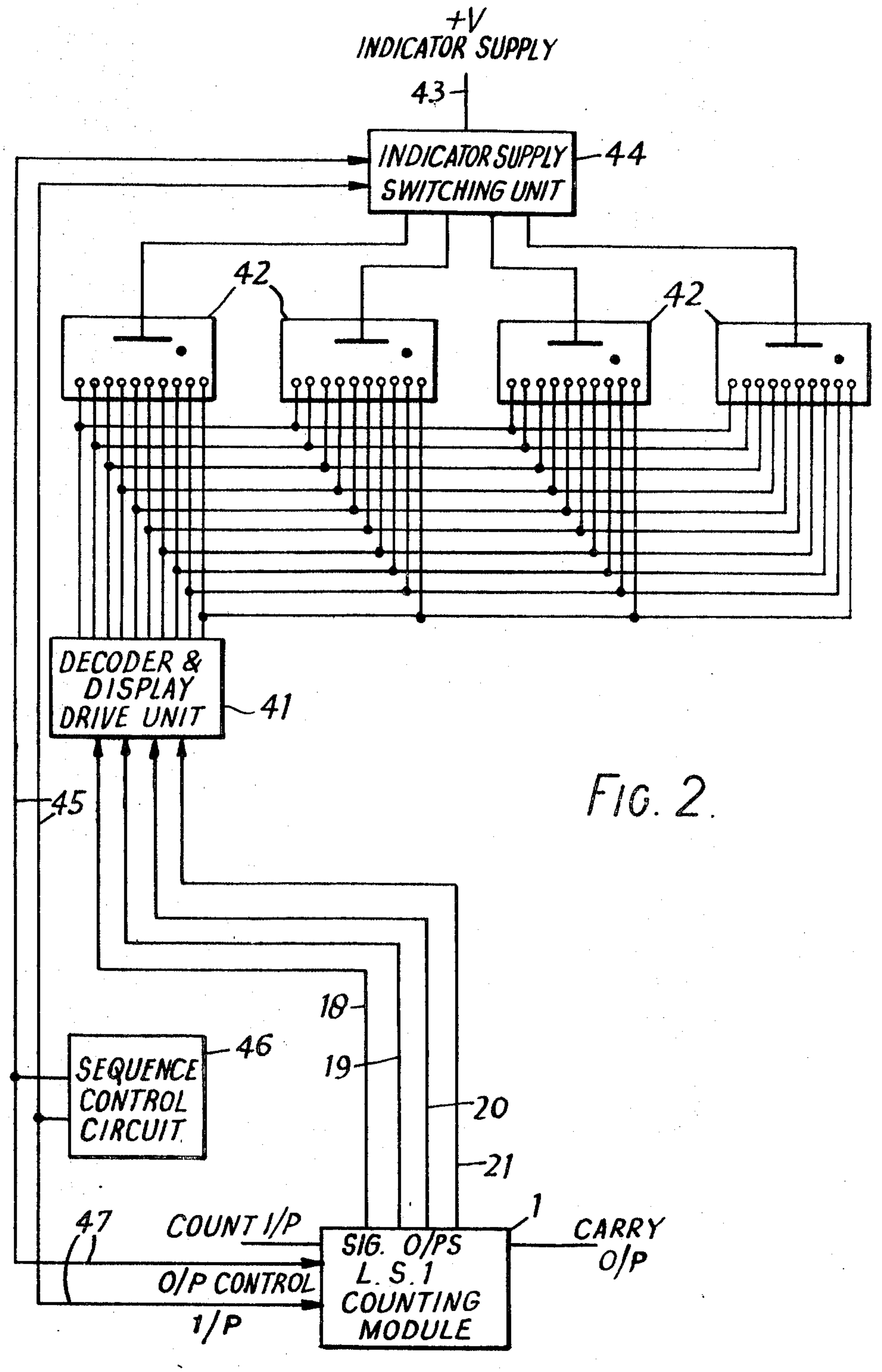
FIG. 2 shows diagrammatically how the chip of FIG. 1 may be used in a sequential display drive arrangement.

FIG. 2 of the drawing shows a sequential display drive arrangement in which a single chip 1 has its output lines 18, 19, 20 and 21 connected to a single remote decoder and display drive unit 41 which in turn drives four cold cathode indicator tubes 42 arranged in parallel. The supply to the anodes of the indicator tubes 42 is carried over line 43 via an indicator supply switching unit 44 operation of which is controlled over lines 45 by a sequence control circuit 46 to energize each tube 42 for only 25 percent of the total time. The control circuit 46 also controls via lines 47 the output control lines 23 and 24 in the chip 1 so that the output from an appropriate decade storage element 10,11, 12 and 13 is fed to a corresponding indicator tube 42. Providing the circuit 46 operates sufficiently rapidly the appearance of the display on the indicator tubes 42 will be static.

It will be understood that FIG. 2 shows only a single chip driving four indicator tubes whereas with cascaded chips any number of groups of tubes may be driven in banks of four (or in banks of -*n*- depending on the number of decade counters in each chip). Although as described above cold cathode indicator tubes have been used it will be understood that other indicators may be employed.

When used in a divider chain of a digital instrument the chips of FIG. 1 would again be cascaded to provide the required overall division factor and in this case the transfer control lines 32 would be held permanently in such state as enables the storage elements 10—13 to follow the decade counters 2—5 continuously.

The required output from the chains of decade counters can be obtained by energizing the control lines 23 and 24 so that the selected decade output is passed to the output lines 18—21. This system automatically provides remote programming of the outputs.

Figure 3:
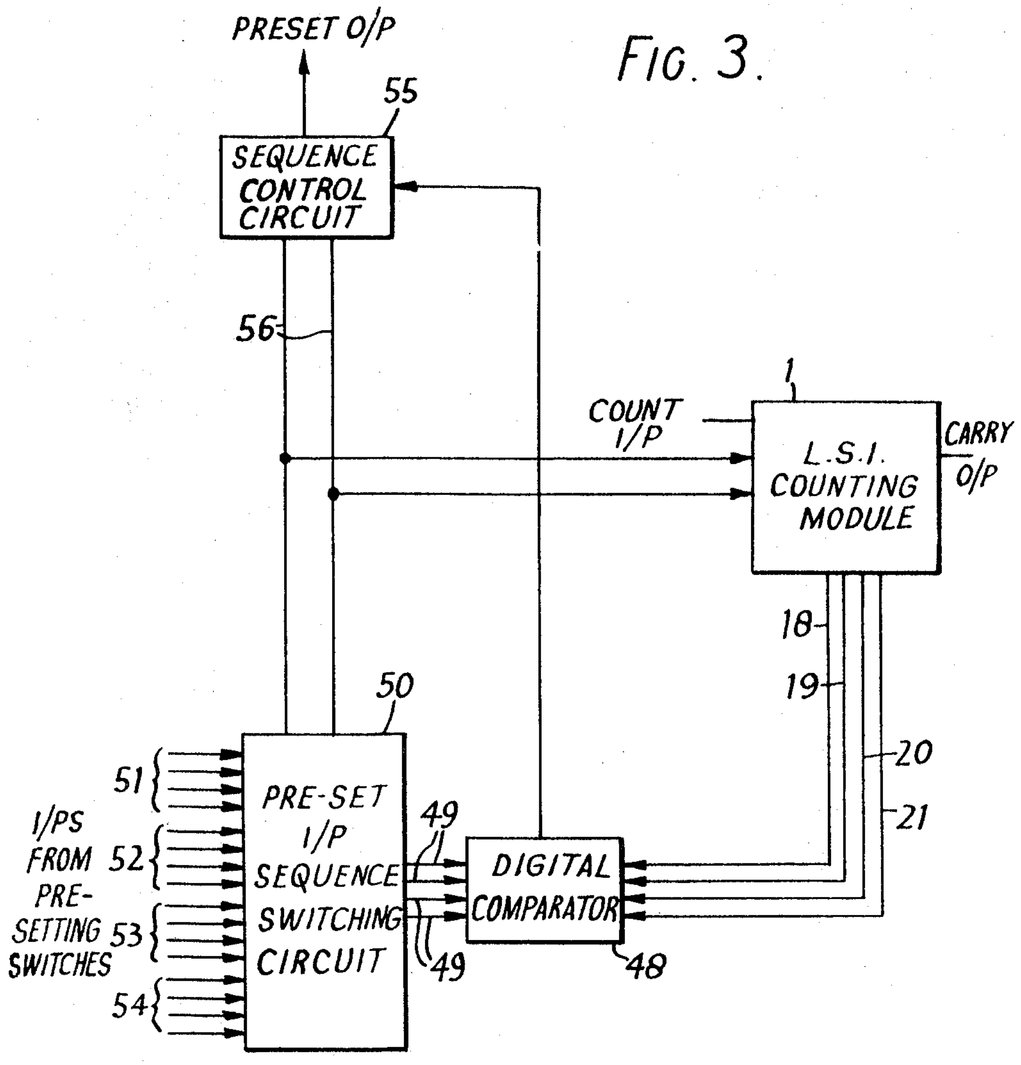
FIG. 3 shows diagrammatically how the chip of FIG. 1 may be used in a variable time base arrangement and FIG. 4 shows a modification of the arrangement of FIG. 1.

If an output other than a decade submultiple of the clock frequency is required then additional external circuitry is necessary. FIG. 3 shows a suitable variable time base arrangement. In FIG. e the coded outputs over lines 18—21 of a chip 1 are fed to a digital comparator 48 the other inputs 49 of which are fed from a preset input sequence switching circuit 50 connected over groups of lines 51,52,53 and 54 to presetting switches. Output from the digital comparator is fed to a sequence control circuit 55 which overlines 56 controls both operation of the switching circuit 50 and the output control logic circuit of the chip 1.

The control lines 56 are initially set up so that comparison of the M.S.D. (most significant digit) is made. When equality is achieved between the decade state and the present value, the digital comparator output causes the states of the control lines 56 to change so as to effect comparison of the second M.S.D. and so on. This sequence continues until comparison is made between the least significant digit and its required count at which point the required output is obtained from the digital comparator 48 via the sequence control circuit 55. In the event that anyone of the selected counts is zero that stage of comparison is omitted.

It is often necessary to obtain a permanent record of the result stored in the counter chain of a digital instrument. This is usually achieved by providing a coded output from each counter stage in parallel which is used to control an external print out device.

However, when using the chip of FIG. 1 a parallel output is not available but a serial output is provided to control the readout system. It is possible to use this output to control additional memory elements (not shown) connected externally of the chip if a parallel output is required.

Very often the printout device is operated serially, especially if low cost systems are used. Devices falling into this category are tape punches and digital printers based on adding machine mechanism. With this class of printer some form of serializer is required to convert the information from the counter into a form suitable for the printer. When chips according to the invention are employed in the counter the serial information can be obtained directly thus simplifying the external equipment. In this application the output gating circuits would be operated sequentially at a rate determined by the requirements of the printer mechanism rather than by the requirements of a visual display.

The arrangement described above is one particular configuration for a chip suitable for digital counter applications. There are however a number of variations which may be made to the internal circuitry as follows:

COUNTERS

Although decade counters have been described above other numerical systems such as octal or duodecimal could be used.

OUTPUT CODING

In the system described the output code has been taken as being a four-wire bc.d. code. Equally well this could be a five-line Johnson code, a 'one out of *n*' code or any other standard arrangement. The use of these alternative codes would increase the number of external connections to the chip but in certain instances this may be acceptable when compared with the alternative of a multiplicity of outputs from each decade counter.

STORAGE ELEMENTS

If a storage facility is not required the chip would still operate in a similar manner to that described above. In this instance the resultant count could only be displayed correctly while the decade counters 2 to 5 are static unless some other form of storage element were connected externally.

DECADE OUTPUTS

In some instances the intermediate decade carry pulse outputs may be required in parallel. This may be achieved by utilizing a further three external connections to the chip.

OUTPUT CONTROL

The system described uses a two-wire control system for the output control circuit 22 and employs a binary coding arrangement. This gives the minimum number of inputs possible to control four outputs. However, other systems are possible such as a separate control wire for each stage. This may be preferable in spite of the increased external connections required.

NUMBER OF STAGES

The system described utilizes four stages per chip as this is felt to be the optimum for the majority of applications. However, there is no reason why a different number of stages should not be included. For a chip containing eight stages the external connections would be increased by one.

INPUT GATING

As already stated earlier it is often required to control the flow of input pulses to the decade chain. This may be effected by including the gating circuit 39 in series with the count input of the first decade 2. The control to this gate over the line 40 could have a logic level which would determine whether pulses were passed to the decade or not. When cascading the chips or when the gating facility was not required the control line would be held at a logic level such that the pulses passed continuously to the counters.

RESET FACILITIES

In FIG. 1 only a single reset input 38 is shown to provide reset to zero facilities only. This reset does not affect the storage elements 10—13. In some instances it may be desirable to have additional reset lines to reset the decades to say nine or to reset the storage units. These may be included but result in an increased number of external connections.

Figure 4:
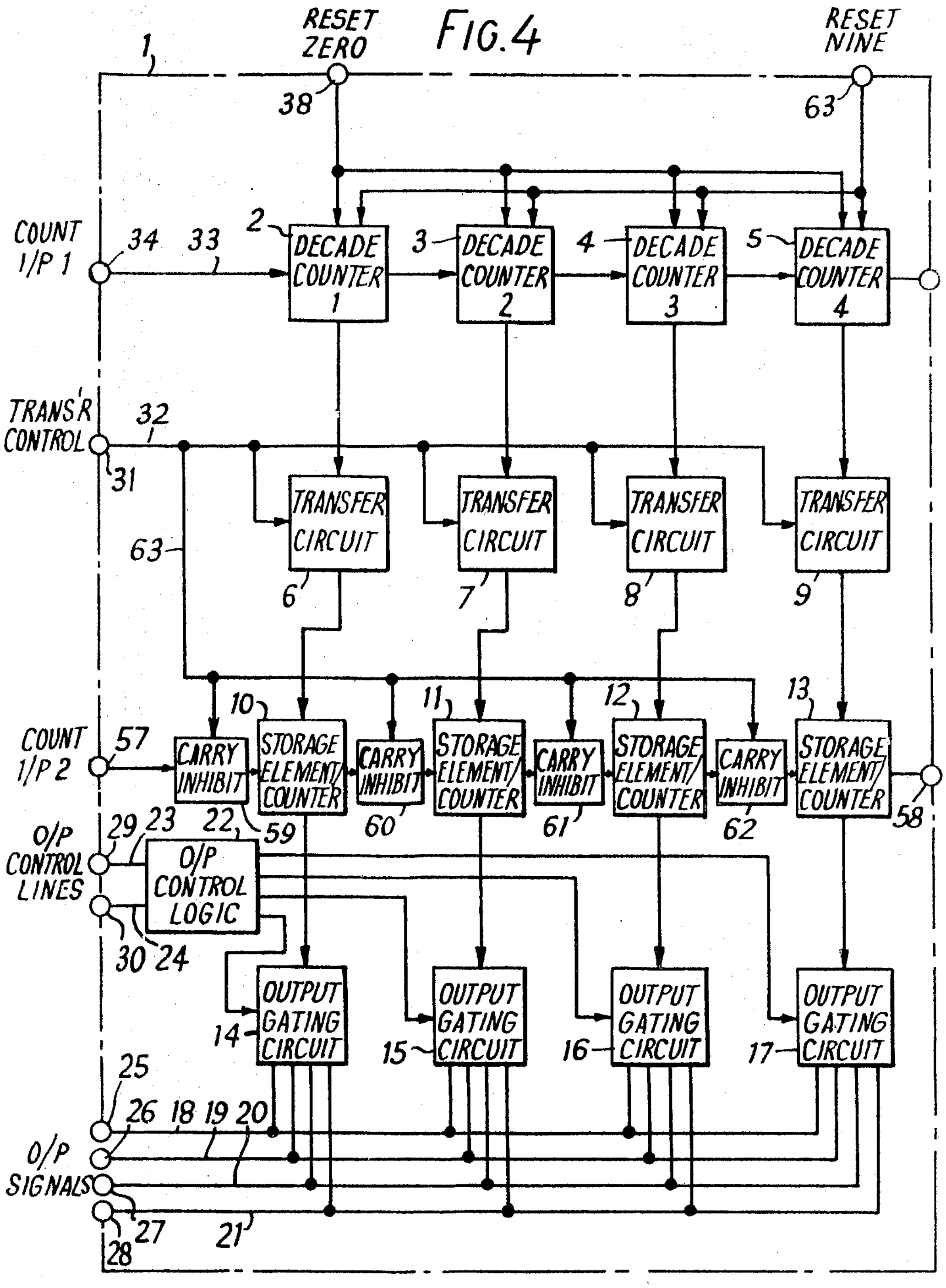

It will be appreciated that the storage elements 10,11,12, and 13 of FIG. 1 are normally bistable elements similar to those at 2,3,4 and 5 constituting the first decade counter chain and since there is one storage element for each decade counter the group of storage elements may readily be used to provide a second decade counter chain. Such an arrangement is shown in FIG. 4 of the drawings where it will be seen that an additional input bonding pad 57 is provided on the chip and the elements 10,11,12 and 13 are connected in cascade between this bonding pad and an additional output bonding pad 58 via four switch units 59,60,61 and 62 the latter each being triggered over a line 63 connected with the line 32 so that when the latter is in the state which causes the element 10,11,12 and 13 to be coupled with the counters 2,3,4 and 5 the switch units 59 to 62 are inhibited so that the system performs exactly as described with FIG. 1 above. However when the line 32 is held in the state to isolate the element 10,11,12, and 13 from the counters 2,3,4, and 5 the switch units 59 to 62 permit the elements 10 to 13 to operate in cascade as a second decade counter chain.

As described above it is necessary to provide with this arrangement two additional bonding pads on the chip and it is also necessary to provide means for resetting the counting chains constituted by the elements 10 to 13 to zero or nine. To obviate the use of additional bonding pads and associated input circuitry for this purpose resetting can be achieved by first resetting the counters 2,3,4 and 5 to the required state and at the same time energizing the line 32 to convert the elements 10 to 13 into the storage mode whereupon they will take up the state existing in the counters 2 to 5.

It will be noted that FIG. 4 incorporates an additional bonding pad 68 over which signals may be passed to the counters 2 to 5 to reset the latter to nine.

At the present time the preferred arrangements for integrated circuit chips of the form proposed have either 14 or 16 bonding pads. The power supplies to the devices would normally require the use of three pads leaving a maximum of 11 or 13 for the circuit connections. In the preferred form of the unit the required connections are as follows: Input and output signals to the decade chains —four leads: coded output signals —four leads; output control, reset zero, reset nine, transfer control —five leads. This requires a total of 13 connections which means that the device can be fitted into one of the preferred packages.

As proposed earlier the output control can be effected over two lines using a binary code, with two additional lines being used for reset zero and reset nine inputs to the first decade chain. The use of a binary code of this form means that one of the output channels is always energized. To prevent this, which is necessary in systems using more than one unit, requires the use of a further control line. In practice it is more convenient for the output control to be effected from a "1 out of *n*" code so that each output channel is selected by changing the state of one line only. To enable the same number of connections to be used as before the reset zero and reset nine functions can be combined with the output control functions so that, for example, if all four lines are held at the logic 'zero' level all the output channels will be inhibited, each output being selected by raising the appropriate one of the control lines to the logic 'one' level. Reset zero and reset nine are energized by raising a combination of control lines to the 'one' level. This system enables all the required operations to be achieved using four control lines only.

In practice an M.O.S. version of the device will normally operate with a negative supply line. Since the device will normally be used in conjunction with bipolar devices which normally require a positive supply line it is more convenient to operate the M.O.S. device with the main h.t. supply earthed. It is therefore more convenient to use the control lines at the logic 'one' level with respect to the internal logic circuitry (i.e. max. negative level) to inhibit the output functions and to take the appropriate line(s) to the logic 'zero' level to obtain the required action. This arrangement provides logic levels compatible with the bipolar requirements.

This modified version of the module offers several advantages over the form of FIG. 1. In divider chain applications in digital counters the storage elements are not required as such and are simply used to connect the required decade counter to the output gating circuit when using the simple form of unit. Most divider chains require overall division factors of the order of $10^6$ to $10^8$ which necessitates the use of two modules connected in cascade. In the modified version the required division factor can be achieved using only one module. For division factors of 10 to $10^4$ the oscillator would be fed directly into the storage/counter chain or into the first decade counter chain with the second chain acting as a permanently connected store as originally proposed. For division factors of $10^5$ to $10^8$ the oscillator would be fed to the first decade counter chain the output of which would be fed to the second decade chain now isolated from the first. In each case the required output is obtained via the appropriate output gating circuit. The device can still be used as originally proposed in counting applications. In practice, when used in divider chain application, the second decade chain is fed either from the reference oscillator or from the output of the first decade chain which is in turn fed by the reference oscillator.

An alternative arrangement is to couple the input of the second decade chain via internal gating circuits to the input and output of the first decade chain. Since it is not really necessary to provide a carry pulse output from the second decade chain the package connections used for the input and output of the second decade chain may be used to provide the control signals to these additional gates.

This arrangement has the advantage that the external switching arrangement has only to control DC signals, there is no necessity to take actual count signals to the switch which may be situated a considerable distance away from the module.

I claim:

1. An integrated circuit package having a plurality of package connection electrodes and containing a semiconductor chip, the semiconductor chip having formed thereon,
   - a first chain of n first count to X circuit elements each having an individual output, an input terminal to the chain connected to a first of said connection electrodes, a reset terminal for the chain connected to a second of said connection electrodes, said first chain being arranged to divide by $X^n$,
   - a plurality of storage count to X circuit elements associated one with each of said n first count to X circuit elements, each said storage count to X circuit elements having an individual input and an individual output,
   - a plurality of transfer gate circuit elements interposed one between the individual output of each said first count to X circuit element and the individual input of its associated storage count to X circuit element, each said transfer gate having a control input terminal for a signal to transfer the content of its respective first count to X circuit element to its associated storage count to X circuit element and the input terminals of all said transfer gates being connected to a third of said connection electrodes, and a plurality of output gate circuit elements associated one with each said storage count to X circuit element and connected to the output thereof, each said output gate circuit element having an output connected to a first group of said connection electrodes and a control input terminal operatively connected to a second group of said connection electrodes so that the content of each said storage count to X circuit element may be made selectively available at said second group of connection electrodes.

2. An integrated circuit package as claimed in claim 1, including a plurality of carry inhibit gate circuit elements formed on said chip, one between each of said storage count to X circuit elements to connect them in cascade to form a second chain arranged to count to X", each said carry inhibit gate having an inhibit input terminal connected to said third connection electrode.

3. An integrated circuit package as claimed in claim 1, including an input gate circuit element formed on said chip, arranged between said input terminal of said first chain of count to X circuit elements and said first connection electrode, and having a gating input terminal connected to a fourth of said plurality of connection electrodes.

4. An integrated circuit package as claimed in claim 1, wherein said first chain of count to X circuit elements has an output terminal connected to a fifth of said plurality of connection electrodes.

5. An integrated circuit package as claimed in claim 2, wherein said second chain of count to X circuit elements is provided with an input terminal and a further carry inhibit gate is formed on said chip arranged between said second chain input terminal and a sixth of said plurality of connection electrodes, the further carry inhibit gate having an inhibit terminal connected to said third connection electrode.

6. An integrated circuit package as claimed in claim 2, wherein said second chain of count to X circuit elements is provided with an output terminal connected to a seventh of said plurality of connection electrodes.

7. An integrated circuit package as claimed in claim 2, wherein an output control circuit element is formed on said chip arranged between said first group of connection electrodes and the control input terminals of said output gate circuit element, whereby coded signals applied to said first group of connection electrodes may select the operation of said output gates.

8. An integrated circuit package as claimed in claim 7, wherein said first and storage count to X circuit elements are each decade counting binary circuit groups and said output gate outputs are connected to eighth, ninth, 10th and 11th of said plurality of connection electrodes forming said first group.

9. An integrated circuit package as claimed in claim 7, wherein there are four each of said first and storage count to X circuit elements and said output control circuit is connected to 12th and 13th of said plurality of connection electrodes forming said second group.